United States Patent
Lips et al.

(10) Patent No.: US 9,989,600 B2
(45) Date of Patent: Jun. 5, 2018

(54) FEEDING CIRCUIT ARRANGEMENT FOR SUPPLYING A RADIO FREQUENCY SIGNAL TO A PLURALITY OF COIL ELEMENTS OF A MAGNETIC RESONANCE COIL SYSTEM

(71) Applicant: KONINKLIJKE PHILIPS N.V., Eindhoven (NL)

(72) Inventors: Oliver Lips, Hamburg (DE); Christoph Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 797 days.

(21) Appl. No.: 14/401,008

(22) PCT Filed: May 3, 2013

(86) PCT No.: PCT/IB2013/053511
§ 371 (c)(1),
(2) Date: Nov. 13, 2014

(87) PCT Pub. No.: WO2013/171611
PCT Pub. Date: Nov. 21, 2013

(65) Prior Publication Data
US 2015/0177342 A1    Jun. 25, 2015

Related U.S. Application Data

(60) Provisional application No. 61/646,392, filed on May 14, 2012.

(51) Int. Cl.
*G01R 33/34* (2006.01)
*G01R 33/3415* (2006.01)
(Continued)

(52) U.S. Cl.
CPC ........... *G01R 33/34* (2013.01); *G01R 33/288* (2013.01); *G01R 33/3415* (2013.01);
(Continued)

(58) Field of Classification Search
CPC .. G01R 33/34; G01R 33/288; G01R 33/3415; G01R 33/3657; G01R 33/3664; G01R 33/387; G01R 33/543; G01R 33/583
See application file for complete search history.

(56) References Cited

U.S. PATENT DOCUMENTS

| | | | |
|---|---|---|---|
| 6,377,044 | B1 | 4/2002 | Burl et al. |
| 6,969,992 | B2 | 11/2005 | Vaughan |

(Continued)

FOREIGN PATENT DOCUMENTS

| | | |
|---|---|---|
| WO | 2007124246 A1 | 11/2007 |
| WO | 2009105701 A1 | 8/2009 |
| WO | 2010020917 A1 | 2/2010 |

OTHER PUBLICATIONS

Kim, K. et al "Improved B1+ Field using a 16-Channel Transmit Head Array and an 8-Channel pTx System at 7T", Proceedings of the International Society on Magnetic Resonance in Medicine, vol. 19, 2011, pp. 3829.

(Continued)

*Primary Examiner* — Gregory H Curran (57) ABSTRACT

A feeding circuit arrangement (18) supplies a radio frequency signal to a plurality of coil elements (14) of a magnetic resonance coil system (12). The circuit arrangement (18) includes a main line (20) for connecting a radio frequency signal source (16); a plurality of feeding lines (22), each feeding line (22) for connecting a corresponding coil element (14) of the coil system (14); a power divider (24) arranged between the main line (20) and the plurality of feeding lines (22) for distributing the signal on the main line (20) to each of the feeding lines (22). At least one of the feeding lines (22) includes a controllable switching circuit (26) with a switching element (28) for connecting/disconnecting of two resulting line sections (30, 32) of the feeding line (22), a first line section (30) on the divider side and a (Continued)

second line section (32) on the side connectable to the coil element (14). The switching circuit (26) further includes at least one connectable termination element (44) for line termination of the first line section (30) or the main line (20) includes a circulator device (60) interconnected with a termination (62).

13 Claims, 5 Drawing Sheets (51) Int. Cl.
G01R 33/36 (2006.01)
G01R 33/28 (2006.01)
G01R 33/387 (2006.01)
G01R 33/54 (2006.01)
G01R 33/58 (2006.01)

(52) U.S. Cl.
CPC ..... *G01R 33/3657* (2013.01); *G01R 33/3664* (2013.01); *G01R 33/387* (2013.01); *G01R 33/543* (2013.01); *G01R 33/583* (2013.01)

(56) References Cited

U.S. PATENT DOCUMENTS

| 7,508,214 | B2 | 3/2009 | Misic |
| 7,615,999 | B2 | 11/2009 | Graesslin |
| 7,633,293 | B2 | 12/2009 | Olson |
| 2006/0025088 | A1 | 2/2006 | Pietig |
| 2009/0174498 | A1* | 7/2009 | Xing ............ G01R 33/3664 333/101 |
| 2009/0201019 | A1* | 8/2009 | Zhai ............ G01R 33/34046 324/307 |
| 2013/0119991 | A1 | 5/2013 | Soutome et al. |

OTHER PUBLICATIONS

Junge, S. et al "Current Sheet Antenna Array—a Transmit/Receive Surface Coil Array for MRI at High Fields", Proceedings of the International Society on Magnetic Resonance in Medicine, vol. 11, 2004, pp. 41.

Strupp, J.P. et al "Eficient Tune and Match with Multiple Transmit Coils", Proceedings of the International Society on Magnetic Resonance in Medicine, vol. 16, 2008, pp. 1135.

* cited by examiner

FEEDING CIRCUIT ARRANGEMENT FOR SUPPLYING A RADIO FREQUENCY SIGNAL TO A PLURALITY OF COIL ELEMENTS OF A MAGNETIC RESONANCE COIL SYSTEM

CROSS-REFERENCE TO PRIOR APPLICATIONS

This application is the U.S. National Phase application under 35 U.S.C. § 371 of International Application No. PCT/IB2013/053511, filed on May 3, 2013, which claims the benefit of U.S. Provisional Patent Application No. 61/646,392, filed on May 14, 2012. These applications are hereby incorporated by reference herein.

FIELD OF THE INVENTION

The invention relates to the field of feeding circuit arrangements for supplying a radio frequency (RF) signal to a plurality of coil elements of a magnetic resonance (MR) coil system. The invention further relates to a corresponding parallel transmitter system, especially a parallel transceiver system, for a magnetic resonance system and to a method for switching the coil elements of a parallel transmitter system.

BACKGROUND OF THE INVENTION

Multi-element radio frequency (RF) coil systems are becoming a central component of high field magnetic resonance (MR) systems in order to reduce SAR and to improve $B_1$-homogeneity. Also at lower field strength local parallel transceiver (TX) systems are gaining significant interest since they have the potential to reduce system cost.

Especially in MR coil systems with a plurality of coil elements supplied by one RF signal source there are obvious developments to use more coil elements than transmit channels of the system. This means, that several coil elements are fed simultaneously by one transmit channel via a feeding circuit arrangement comprising a power divider (splitter, hybrid coupler, . . . —with or without phase shifters) and a plurality of feeding lines. In this way fixed amplitude and phase relationships between the coil elements of one TX channel can be set. The principle can also be used in single TX channel systems (like 1.5 Tesla systems) to feed TX coil arrays.

Patent specification U.S. Pat. No. 7,633,293 B2 shows a very complex parallel transceiver system with a RF signal source, a magnetic resonance coil system with a plurality of coil elements and a feeding circuit comprising a plurality of feeding lines, wherein each feeding line for feeding a corresponding coil element comprises a high-power amplifier and a transmit-receive switching device for each coil element. The transmit-receive switching devices operate to switch between transmission and receiving circuits for each of the coil elements.

SUMMARY OF THE INVENTION

It is an object of the invention to provide a simple but dynamically switchable feeding circuit arrangement for supplying a radio frequency signal to a plurality of coils of a magnetic resonance coil system and a parallel transceiver system for a magnetic resonance system with a magnetic resonance coil system comprising a plurality of coil elements.

The feeding circuit arrangement according to the invention comprises (i) a main line for connecting a radio frequency signal source; (ii) a plurality of feeding lines, each feeding line for connecting a corresponding coil element of the coil system; (iii) a power divider arranged between the main line and the plurality of feeding lines for distributing a signal on the main line to each of the feeding lines.

At least one of the feeding lines comprises a controllable switching circuit with a switching element for connecting/disconnecting of two resulting line sections of the feeding line, a first line section on the divider side and a second line section on the side connectable to the coil element. The switching circuit further comprises at least one connectable termination for line termination of the first line section or the main line comprises a circulator device interconnected with a termination means. The at least one termination element or the termination means has a predefined termination resistance (termination impedance) for line termination. The switching elements are controllable by a controller by means of DC bias voltages. Preferably, all feeding lines comprise controllable switching circuits with a respective switching element. The switches allow a switching of individual coil elements without effecting the proper function of the power divider (or equivalent device). In this way the array of coil elements can be adjusted to the actual field of view (FoV), thus reducing SAR (SAR: Specific Absorption Rate) and potential fold-over artifacts. The feeding circuit arrangement enables to selectively deactivate single coil elements, which leads to additional degrees of freedom to optimize the transmission (TX) fields even for systems with low TX channel count.

According to a preferred embodiment of the present invention, the at least one termination element or the termination means is a passive component.

According to another preferred embodiment of the present invention, the at least one termination element is connected in series with a further switching element for connecting the termination element with the corresponding first line section.

According to another preferred embodiment of the present invention, the termination element for line termination of the at least one (open-ended) first line section connected to the power divider has a predefined termination resistance of 50 ohms or 100 ohms.

According to yet another preferred embodiment of the present invention, a further termination element for line termination of the at least one (open-ended) second line section connectable to the corresponding coil element has a predefined termination resistance of zero ohm or 50 ohms or 100 ohms or more than 10 kilo ohm and contains optionally a lambda/4 element in order to transform the termination resistance.

In general, the switching element(s) can be any type of switching elements suitable for RF applications. According to a preferred embodiment of the present invention, the switching element(s) is/are a PIN diode(s) and/or the further switching element(s) is/are a PIN diode(s). A PIN diode is a diode with a wide, lightly doped 'near' intrinsic semiconductor region between a p-type semiconductor region and an n-type semiconductor region. The p-type and n-type regions are typically heavily doped because they are used for ohmic contacts. The wide intrinsic region is in contrast to an ordinary PN diode. The wide intrinsic region makes the PIN diode suitable for an application as a very fast switch.

According to a preferred embodiment of the present invention, the feeding circuit arrangement further comprises at least one transmit-receive switching device.

According to a preferred embodiment of the present invention, the at least one transmit-receive switching device is a switching device independent from the at least one switching circuit. According to an alternative preferred embodiment of the present invention, the main line comprises the one transmit-receive switching device or each of the feeding lines comprises one of the transmit-receive switching devices.

According to another preferred embodiment of the present invention, the power divider is a splitter device or a hybrid device or at least comprises a splitter unit or hybrid unit. Splitter and Hybrid device are well known devices for dividing the power of a main line into a plurality of lines. the power divider comprises at least one phase shifter element for shifting the phase of at least one feeding line.

According to yet another preferred embodiment of the present invention, all electrical components of the feeding circuit arrangement (components of the power divider, lines and termination elements) except for the at least one pin diode, are passive components.

The parallel transmitter system, especially transceiver system, for a magnetic resonance system according to the invention includes a magnetic resonance coil system comprising a plurality of coil elements, a RF signal source, an aforementioned feeding circuit arrangement and a controller system with a controller for controlling the switching elements of the switching circuit.

In the method for switching the coil elements of a parallel transmitter system according to the invention, the switching is performed by means of the controller system and the switching elements in dependence of calibration data and/or user a input.

According to a preferred embodiment of the present invention, the calibration data are data of a sensitivity profile of the coil elements and/or data of positions of the coil elements.

According to another preferred embodiment of the present invention, the user input is/are a selection of a field of view and/or a selection of a type of scan.

The invention further relates to a data storage device encoding a program in machine-readable and machine-executable form to perform the aforementioned method.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
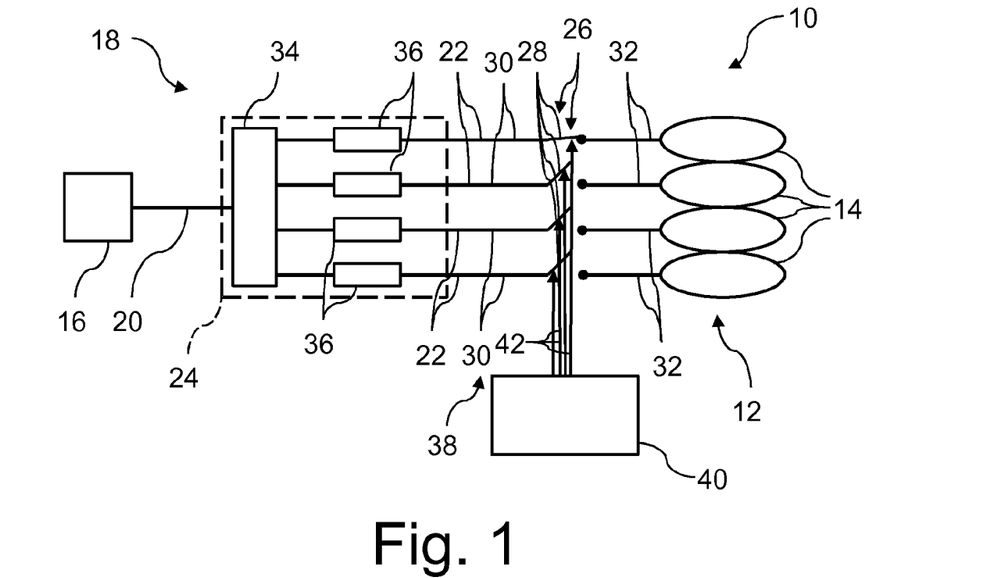
FIG. 1 shows a parallel transceiver system for a magnetic resonance system comprising a feeding circuit arrangement.

FIG. 1 shows a parallel transceiver system 10 for a magnetic resonance system with a magnetic resonance coil system 12 comprising a plurality of coil elements 14, a radio frequency (RF) signal source 16 and a feeding circuit arrangement 18 for transmitting a radio frequency signal of the signal source 16 to the plurality of coil elements 14. The feeding circuit arrangement 18 includes a main line 20 electrically connecting the radio frequency signal source 16 and a plurality of feeding lines 22, each feeding line 22 for connecting a corresponding coil element 14 of the coil system 12. The feeding circuit arrangement 18 further includes a power divider 24 arranged between the main line 20 and the plurality of feeding lines 22 for distributing the signal from the signal source 16 (a signal generating device) via the main line 20 to the feeding lines 22. Each of the feeding lines 22 comprises a controllable switching circuit 26 with a switching element 28 for connecting/disconnecting of two resulting line sections 30, 32 of the corresponding feeding line 22. The power divider 24 comprises a splitter device 34 and a plurality of phase shifter elements 36 for shifting the phase of the signal transmitted over each of the feeding lines 22 individually. The transceiver system further comprises a controller system 38 with a controller 40 for controlling the switching elements 28 of the switching circuits 26 (arrows 42).

There are several ways to realize the required power divider 24, e.g. splitter device 34, hybrid device, Wilkinson divider, Gysel power splitter, rat race coupler, etc. These devices distribute the input power to a number of output ports. Phase differences at these output ports are either inherent in the splitter design (e.g. 90° hybrid) or can be implemented by additional phase shifter elements 36 (e.g. transmission lines of defined lengths). These dividers 24 (splitters 34) can also be cascaded in order to increase the number of output channels.

Figure 2:
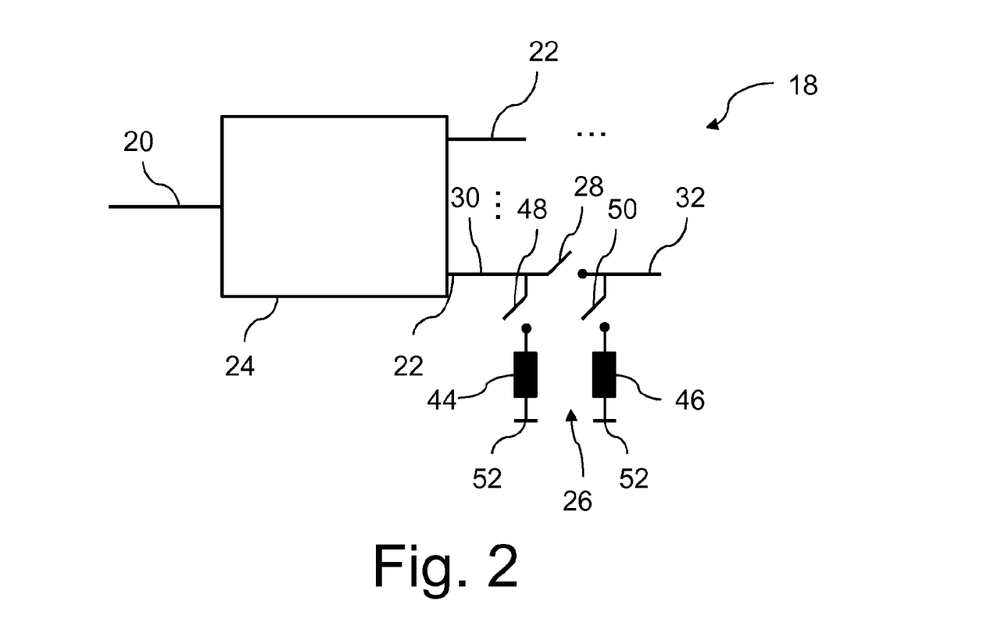
FIG. 2 shows a feeding circuit arrangement according to a first preferred embodiment of the invention.

FIG. 2 shows the feeding circuit arrangement 18 and especially one of the switching circuits 26 in a more detailed way on the example of one of the feeding lines 22. The switching circuit 26 comprises the switching element 28 in the feeding line 22 between the two line sections 30, 32 and two corresponding cross connection current paths. Each cross connection current path comprises a termination element 44, 46 with a predefined termination impedance $Z_0$ for line termination of the two line sections 30, 32 of the corresponding feeding line at the ports of the switching element 28. Each of the termination elements 44, 46 is connected in series with a further switching element 48, 50. Each of these series connections couples the corresponding port of the switching element 28 to a reference potential (ground 52). The further switching elements 48, 50 are controllable by the controller 40 as well.

Figure 3:
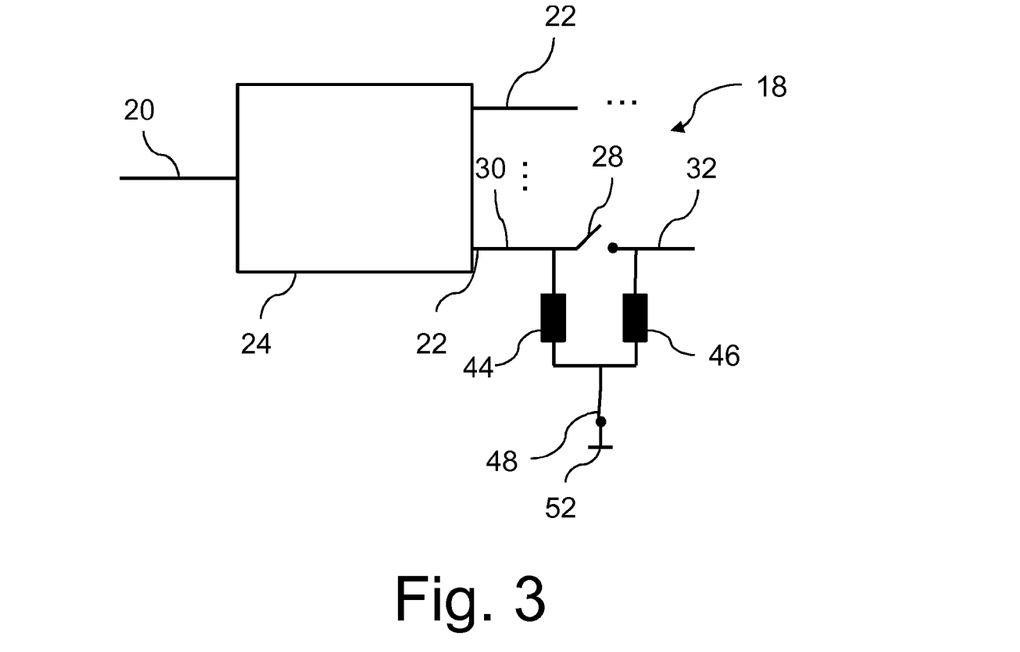
FIG. 3 shows a feeding circuit arrangement according to a second preferred embodiment of the invention.

FIG. 3 shows a second embodiment of the feeding circuit arrangement 18. In this embodiment, the two termination elements 44, 46 are switched by a common further switching element 48. This common further switching element 48 is connected in series with a parallel connection of the two termination elements 44, 46. The first termination element 44 of these termination elements is connected with the first line section 30 and the second termination element 46 is connected with the second line section 32.

Figure 4:
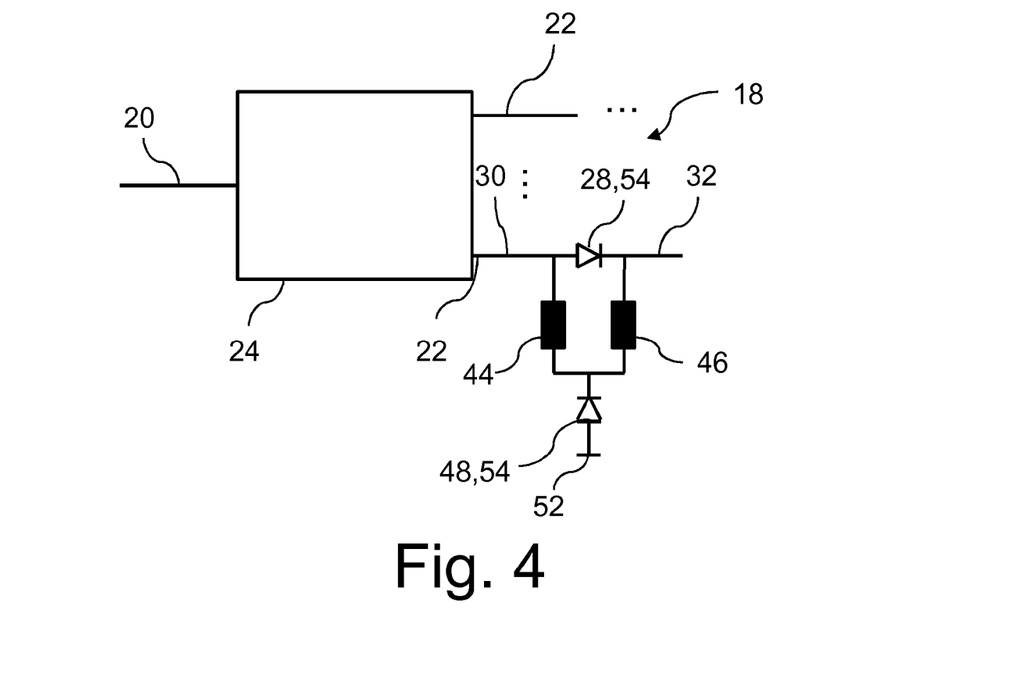
FIG. 4 shows a feeding circuit arrangement according to a third preferred embodiment of the invention.

FIG. 4 shows a third embodiment of the feeding circuit arrangement 18. In this embodiment, the switching element 28 is realized by a controllable PIN diode 54 and the further switching element 48 is realized by a controllable PIN diode 54, too. The arrangement of the components generally corresponds to the arrangement shown in FIG. 3.

The switching elements 28 to disable coil elements can be realized e.g. employing FET-switches, relays or preferably PIN diodes 54. Exemplifying switching setups are shown in FIGS. 2 and 3 and an embodiment applying PIN diodes 54 is depicted in FIG. 4. The output ports of the power divider 24 have to be terminated by their characteristic impedance $Z_0$ in order to ensure proper function. These resistors must be able to absorb the power otherwise transmitted to the coil. Since such resistors are already present in many splitter designs (Wilkinson, Gysel, . . . ) the switches and the corresponding termination elements 44 (with termination impedance $Z_0$) are preferably placed physically at the site of the divider/splitter 24.

Figure 5:
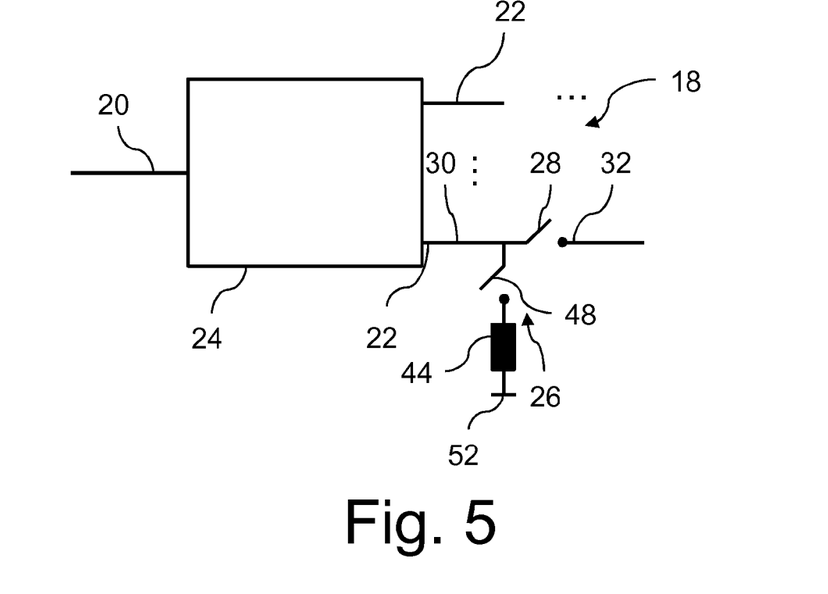
FIG. 5 shows a feeding circuit arrangement according to a fourth preferred embodiment of the invention.
Figure 6:
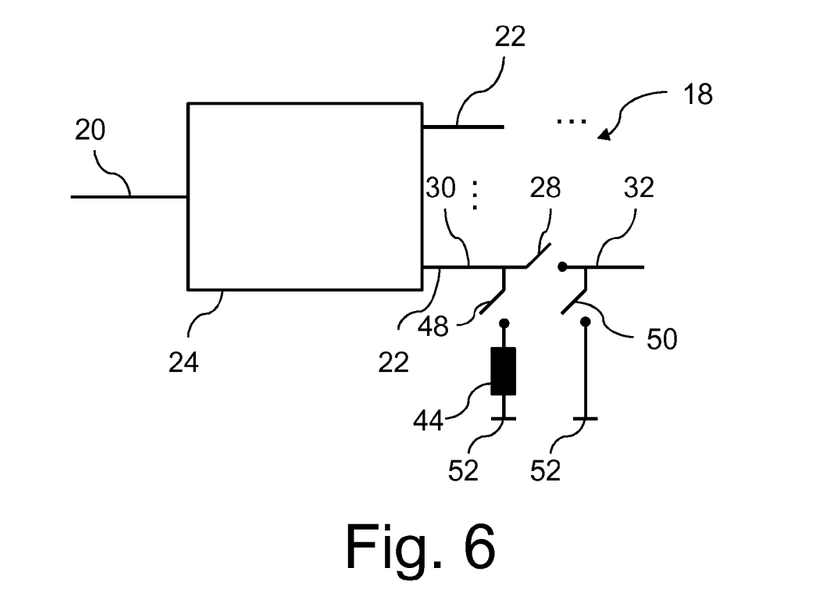
FIG. 6 shows a feeding circuit arrangement according to a fifth preferred embodiment of the invention.

FIG. 5 shows a fourth embodiment of the feeding circuit arrangement 18. FIG. 6 shows a fifth embodiment of the feeding circuit arrangement 18. In these embodiments the port of the corresponding coil elements 14 are not terminated by a termination element. If the coil element 14 is disabled an open (FIG. 5) or short (FIG. 6) is realized at the corresponding feeding line 22, which can be transformed to an open at the coil element 14 itself applying appropriate transmission lines. In this way induced currents in disabled coil elements 14 can be suppressed. Disabling a coil element 14 by the proposed switches the connection to the coil can also be terminated by $Z_0$. In this case the electrical properties of the coil element 14 stay identical, e.g. the induced currents.

Figure 7:
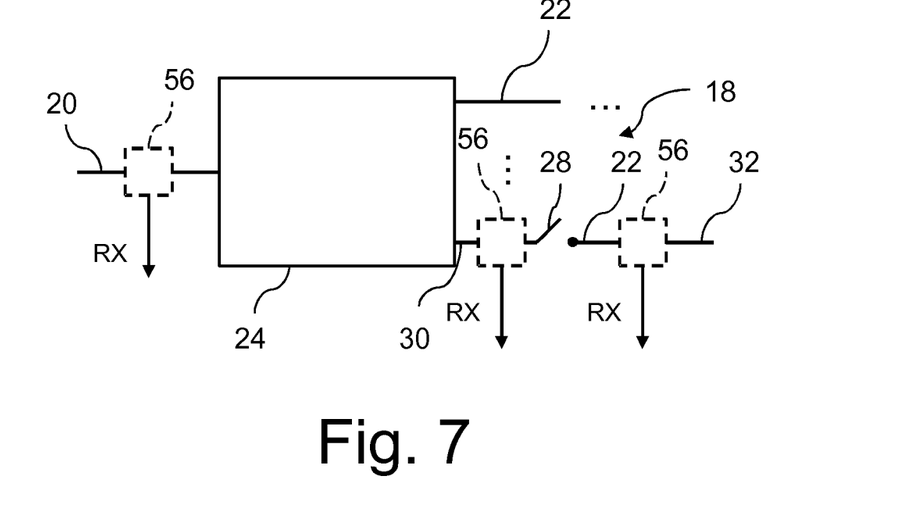
FIG. 7 shows a feeding circuit arrangement according to a sixth preferred embodiment of the invention.

FIG. 7 shows a sixth embodiment of the feeding circuit arrangement 18. In this figure possible positions of a transmit-receive (TX/RX) switching device 56 are indicated. There are three possible positions: (i) in the main line, (ii) in the first line section 30 of a corresponding feeding line 22 or (iii) in the second line section 32 of a corresponding feeding line 22. This kind of transmit-receive switching device 56 is a switching device independent from the at least one switching circuit 26.

The TX/RX switching devices 56 can principally be placed in front of the divider 24, behind the divider 24 in front of the proposed switch and also behind the proposed switch as depicted in FIG. 7. The latter position has the advantage, that RX is always possible independently of the switching state. If the TX/RX switching device is in front of the proposed switching element, the switching element must be closed for RX, but the preamp and thus its noise coupling to other coil elements can be disconnected from the coil array by opening the switching device 28. This is advantageous if the corresponding coil element 14 does not contribute much to the MR signal, but rather couples noise to other coil elements 14. If the TX/RX switching device 56 is placed in front of the divider 24, the RX signals are already combined and no individual RX signals for each coil element 14 can be recorded.

Figure 8:
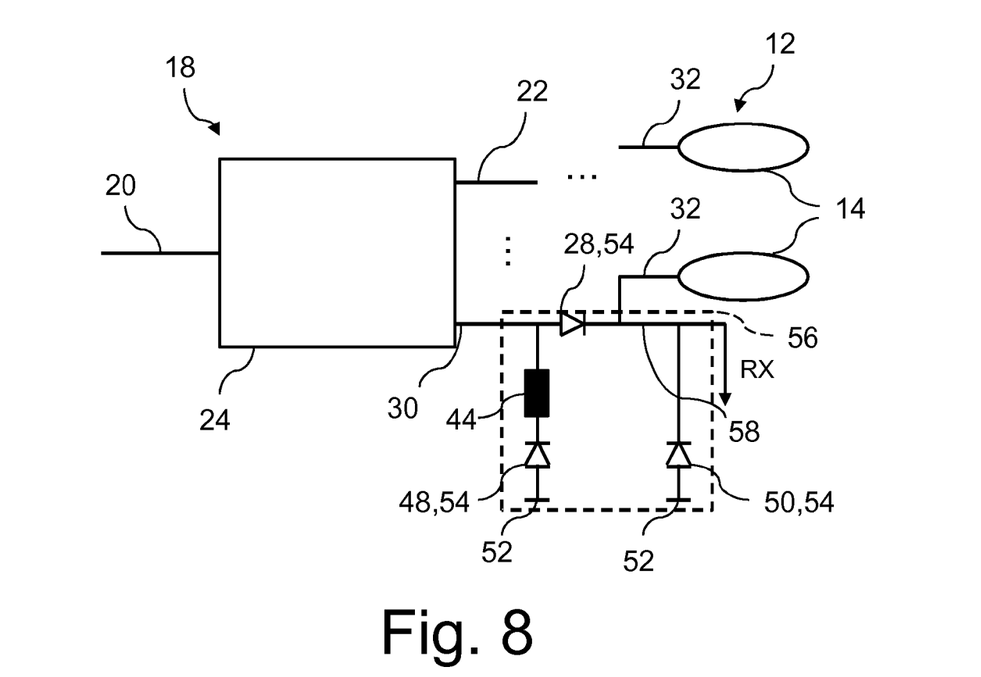
FIG. 8 shows a feeding circuit arrangement according to a seventh preferred embodiment of the invention.

FIG. 8 shows a seventh embodiment of the feeding circuit arrangement 18. In this embodiment the switching circuit 26 can be implemented into the TX/RX switching device 56, as shown in FIG. 8, since the diode 54 is typically already present and can be utilized. Each feeding line 22 comprises a TX/RX switching device 56. Each of the TX/RX switching devices 56 includes a current path comprising a series connection of the switching element 28 (PIN diode 54) and a lambda/4 element 58 between the cross connection current paths with the further switching elements 48, 50. The second line section 32 of the corresponding feeding line 22 branches in a node between the switching element 28 and the lambda/4 element 58 and leads to the corresponding coil element 14.

Figure 9:
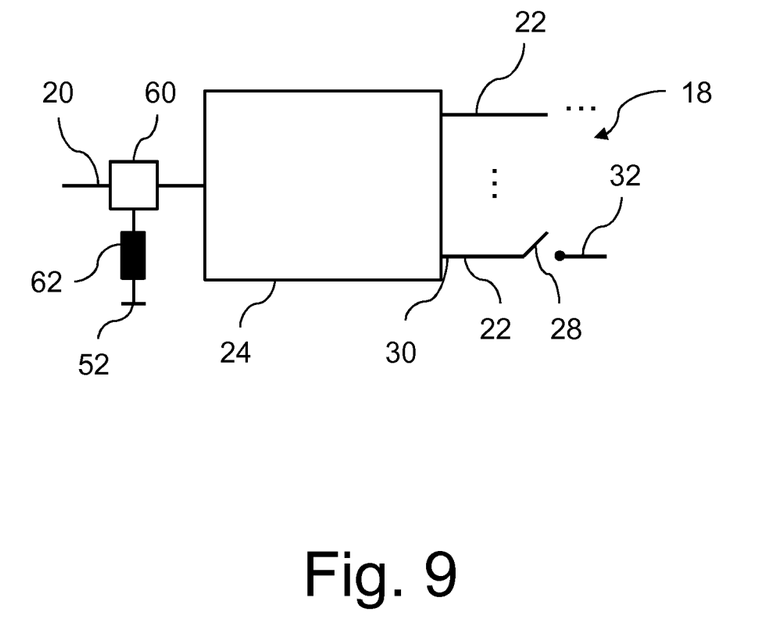
FIG. 9 shows a feeding circuit arrangement according to an eights preferred embodiment of the invention and FIG. 10 shows a block diagram of a control system for the switching elements.

FIG. 9 shows a feeding circuit arrangement according to an eighth embodiment of the invention without a termination element 44 in the switching circuit 26. In this case the main line 20 comprises a circulator device 60 interconnected with a termination means 62. The circulator device 60 reroutes a wave reflected by the open port of the at least one switching element 28 to the termination means 62.

In other words, it is also possible not to terminate the output ports of the divider 24. As already said this degrades its proper function, in particular the matching at its input port (the connection to the TX amplifier). If a circulator in conjunction with matched resistor is used, no performance problems will occur, thus this is also a possible embodiment of the invention.

Figure 10:
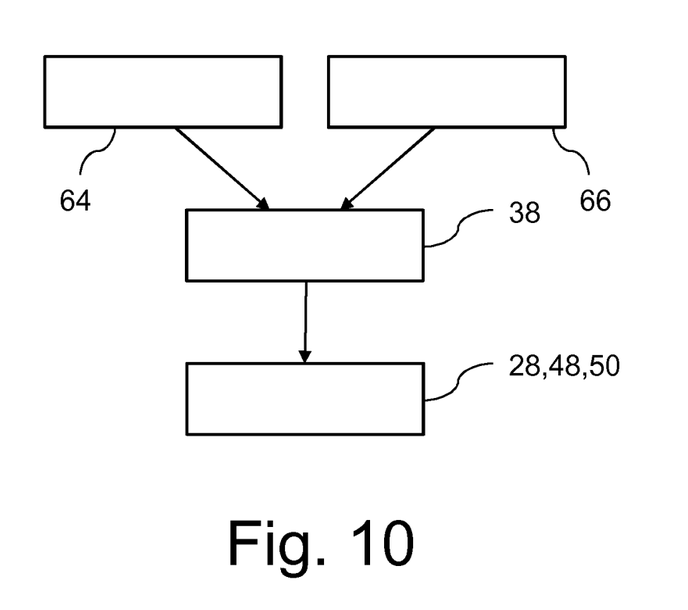

An integral part of the parallel transmitter/transceiver system 10 is the control system 38, which chooses the switching state of the individual TX coil elements 14. This system is depicted in FIG. 10. This control system 38 takes into account calibration data (block 64: sensitivity profile of coils, measured coil positions, . . . ) and user input (block 66: field of view, type of scan, . . . ) and also ensures proper timing of the switching process performed by the switching elements 28 and/or further switching elements 48, 50.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A feeding circuit arrangement for supplying a radio frequency signal to a plurality of coil elements of a magnetic resonance coil system, wherein the circuit arrangement comprises
   a main line configured to connect to a radio frequency signal source;
   a plurality of feeding lines, each feeding line configured to connect to a corresponding coil element of the coil system;
   a power divider arranged between the main line and the plurality of feeding lines and configured to distribute the signal on the main line to each of the feeding lines;
   wherein at least one of the feeding lines comprises a controllable switching circuit with a switching element configured to connect and disconnect two resulting line sections of the at least one feeding line, a first line section of the at least one feeding line being on the divider side and a second line section being on a side configured to connect to the coil element; and
   wherein the switching circuit further comprises at least one connectable termination element with a predefined termination resistance for line termination of the first line section or the main line comprises a circulator device interconnected with a circulator device termination element with the predefined termination resistance, wherein the at least one termination element is connected in series with a further switching element configured to couple the first line section to a reference potential through the termination element.

2. The feeding circuit arrangement according to claim 1, wherein the termination element has a predefined termination resistance of 50 ohms or 100 ohms.

3. The feeding circuit arrangement according to claim 1, wherein a termination element for line termination of at least one of the second line sections has a predefined termination resistance of zero ohm or 50 ohms or 100 ohms or more than 10k ohm or is additionally transformed by a quarter wavelength element.

4. The feeding circuit arrangement according to claim 1, wherein the switching element is a PIN diode.

5. The feeding circuit arrangement according to claim 1, further comprising
at least one transmit-receive switching device.

6. The feeding circuit arrangement according to claim 5, wherein the at least one transmit-receive switching device is a switching device independent from the at least one switching circuit.

7. The feeding circuit arrangement according to claim 5, wherein the main line comprises the one transmit-receive switching device or each of the feeding lines comprises one of a plurality of the transmit-receive switching devices.

8. The feeding circuit arrangement according to claim 1, wherein the power divider comprises at least one phase shifter element configured to shift a the phase of a signal on at least one of the feeding lines.

9. The feeding circuit arrangement according to claim 1, wherein all electrical components of the feeding circuit arrangement, except for the at least one switching element, are passive components.

10. A parallel transmitter system, for a magnetic resonance system, the parallel transmitter system comprising:
a plurality of magnetic resonance coils;
a radio frequency signal source configured to generate magnetic resonance signals;
a feeding circuit including:
a power divider configured to distribute the magnetic resonance signals from the radio frequency signal source among a plurality of feeding lines connected with the plurality of magnetic resonance coils,
a first of the feeding lines including a first switch configured to connect the magnetic resonance signal to one of the magnetic resonance coils and disconnects the one of the magnetic resonance coils from the magnetic resonance signals;
a termination resistance connected in series with a second switch between (1) a portion of the first feeding line between the first switch and the power divider and (2) a reference potential; and
a controller configured to control the first and second switches to selectively direct the magnetic resonance signal to one of one of the magnetic resonance coils and the reference potential.

11. A method for switching coil elements of a parallel transmitter system of a magnetic resonance system the method comprising:
generating a magnetic resonance signal;
distributing the magnetic resonance signal from a main line to a plurality of feeding lines,
wherein at least one of the feeding lines comprises a controllable switching circuit with a switching element configured to connect and disconnect two resulting line sections of the at least one feeding line, a first line section of the at least one feeding line being on a divider side and a second line section being on a side configured to connect to a coil element,
wherein the controllable switching circuit further comprises at least one connectable termination element with a predefined termination resistance for line termination of the first line section,
wherein the at least one termination element is connected in series with a further switching element configured to couple the first line section to a reference potential through the termination element;
controlling the switching elements to connect and disconnect the line sections of the at least one feeding line to selectively direct the magnetic resonance signal to one of the magnetic resonance coils or the reference potential.

12. The method according to claim 11, wherein controlling the switching elements is based on calibration data indicative of a sensitivity profile of the coil elements and/or positions of the coil elements.

13. The method according to claim 11, wherein controlling the switching elements is based on a selection of a field of view and/or a type of scan.

* * * * *